(12) United States Patent
Hayashi

(10) Patent No.: US 6,614,272 B1
(45) Date of Patent: Sep. 2, 2003

(54) SIGNAL VOLTAGE DETECTION CIRCUIT

(75) Inventor: Makiko Hayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/285,455

(22) Filed: Nov. 1, 2002

(30) Foreign Application Priority Data

Aug. 20, 2002 (JP) ........................................ 2002-239635

(51) Int. Cl.[7] .............................................. H03K 5/153
(52) U.S. Cl. ................................ 327/77; 327/55; 327/89
(58) Field of Search ........................... 327/362, 77, 89, 327/55, 57, 52, 53, 65, 66, 307, 560–563

(56) References Cited

U.S. PATENT DOCUMENTS

| | | | | |
|---|---|---|---|---|
| 4,529,891 A | * | 7/1985 | Oida | 327/77 |
| 5,606,268 A | * | 2/1997 | Van Brunt | 327/541 |
| 5,689,460 A | * | 11/1997 | Ooishi | 327/538 |
| 5,721,507 A | | 2/1998 | Fujii et al. | 327/354 |
| 6,037,824 A | * | 3/2000 | Takahashi | 327/337 |
| 6,060,912 A | * | 5/2000 | Opris et al. | 327/57 |
| 6,392,472 B1 | * | 5/2002 | Kobayashi et al. | 327/541 |

FOREIGN PATENT DOCUMENTS

JP           6-242846           9/1994

* cited by examiner

*Primary Examiner*—Toan Tran
(74) *Attorney, Agent, or Firm*—Oblon, Spivak, McClelland, Maier & Neustadt, P.C.

(57) ABSTRACT

A signal voltage detection circuit is provided to include a differential amplifier a differential amplifier having first and second driver transistors to which a reference voltage and a signal voltage to be detected are input respectively, a current mirror circuit configured to generate an output current corresponding to a detection output of the differential amplifier, a current-to-voltage conversion circuit configured to convert a change in the output current of the current mirror circuit into a voltage and for outputting the voltage converted, a latch circuit to which an output of the current-to-voltage conversion circuit is transferred and in which the output is held, and a capacitive load element connected to an input node of the current-to-voltage conversion circuit.

9 Claims, 11 Drawing Sheets

SIGNAL VOLTAGE DETECTION CIRCUIT

CROSS-REFERENCE TO RELATED APPLICATION(S)

This application is based upon and claims the benefit of priority from the prior Japanese Patent Application No. 2002-239635, filed on Aug. 20, 2002, the entire content of which is incorporated herein by reference.

BACKGROUND OF THE INVENTION

1. Field of the Invention

This invention relates to signal voltage detection circuit having a differential amplifier for detecting an input signal voltage and a latch circuit for holding therein a detection result.

2. Description of Related Art

In driver integrated circuits (ICs) for driving power switching devices including, but not limited to, metal oxide semiconductor (MOS) transistors and insulated gate bipolar transistors (IGBTs), signal voltage detection circuitry is used for error detection and the like, by way of example.

FIG. 13 is an exemplary configuration of one prior known signal voltage detection circuit 10 of the type stated above. A differential amplifier 11 has a pair of driver transistors N1, N2, to which a reference voltage Vref and a signal voltage Vin to be detected are input respectively. In order to take out or derive an output current which corresponds to a detection output of this differential amplifier 11, a current mirror circuit 12 is provided. A change in output current of the current mirror circuit 12 is detected by a current-to-voltage conversion circuit 13, which includes a resistor R1 and a transistor MN1 for detection of its terminal voltage. An output of this current-voltage conversion circuit 13 is transferred via an inverter X1 toward a latch circuit 14 and is then held therein.

FIG. 14 is an operation timing diagram of the signal voltage detector circuit 10. When the input signal voltage Vin becomes higher in potential than the reference voltage Vref (at a time point t0), a collector current of the driver transistor N2 of the differential amplifier 11 changes from zero to a constant current. Upon receipt of the detection output of this differential amplifier 11, a drain current flows in P-channel MOS transistors MP1, MP2 which make up a current mirror circuit 12. In responding to receipt of an output voltage of the MOS transistor MP2, a voltage generates across the both terminate ends of the resistor R1 whereby the N-channel MOS transistor MN1 turns on. Thus, the input level of the inverter X1 potentially drops down at "Low" or "L" level, permitting a pulse of "High" or "H" level—say, H pulse—to be input to the latch circuit 14, resulting in retention of a latch output which is represented by Vout=L.

Even when the signal voltage Vin becomes potentially lower than the reference voltage Vref (at a time point t1), the data held in the latch circuit 14 is kept unchanged. The latch circuit 14's hold data will be reset in response to a potential change of a reset signal RST to H level (at t2).

FIG. 15 shows another signal voltage detection circuit 20. This circuit includes its differential amplifier 21, which has an NPN transistor N1 to which the reference voltage Vref is input and a parallel combination of NPN transistors N21, N22 to which two signal voltages Vin1, Vin2 are input respectively. These driver transistors are operatively associated with a load, which is an active load. More specifically, PNP transistors P1, P2 for use as the load are connected to make up a current mirror circuit. The differential amplifier 21 generates a detection output, which is amplified by a voltage amplifying unit 22 with large-amplitude operability and is then sent forth via inverters X1, X2 to a latch circuit 23 and held therein.

FIG. 16 is an operation timing diagram of this signal voltage detector circuit 20. When either one of the input signal voltages Vin1, Vin2 becomes higher in potential than the reference voltage Vref (at time point t0), the collector current of a corresponding one of the driver transistors N21, N22 of the differential amplifier 21 changes from zero to a constant current. Upon receipt of this change, a PNP transistor P3 turns on causing the collector current to flow therein, resulting in an H pulse being obtained at a terminal of resistor R1. Whereby, a voltage of Vout=L is latched in the latch circuit 23.

Even when the signal voltage Vin potentially decreases below the reference voltage Vref (at time point t1), the data held at the latch circuit 23 is kept unchanged. The latch circuit 23's hold data will be reset in response to a potential change of the reset signal RST to H level (at t2).

The signal voltage detector circuits 10 and 20 of FIGS. 13 and 15 are both associated with risks of operation failures or malfunction occurring due to the influence of power supply noises. A timing diagram of the signal voltage detector circuit 10 of FIG. 13 in the case of occurrence of such malfunction is shown in FIG. 17; a timing diagram of the FIG. 15 detector circuit 20 in a similar case is shown in FIG. 18.

Firstly, in the signal voltage detector circuit 10 of FIG. 13, suppose that the power supply voltage Vcc potentially drops down by a certain degree ΔV at a time point t10 as shown in FIG. 17. In response to receipt of this potential drop-down, the current of a current source I1 of the differential amplifier 11 also decreases accordingly. And, when the power supply voltage initiates to recover at a time point t11, a displacement current rushes to flow in a relatively large collector capacitance of the driver transistor N2. This in turn causes a drain current to flow in the P-channel MOS transistors MP1, MP2 of the current mirror circuit 12. Owing to the current of MOS transistor MP2, the terminal voltage of resistor R1 increases in potential. When this voltage goes beyond the threshold voltage of NMOS transistor MN1, this MOS transistor MN1 turns on resulting in the voltage Vout=L of latch circuit 14 being latched unintentionally.

In the signal voltage detector circuit 20 of FIG. 15, assume that the power supply voltage Vcc potentially decreases by ΔV at time point t10 as shown in FIG. 18. In this case, the current of current source I1 of the differential amplifier 21 also decreases. Simultaneously, the PNP transistors P1, which make up the current mirror with the PNP transistor P2 and is flowing a constant current, also decreases in collector current thereof. Upon potential recovery of the power supply voltage from time point t11, the collector current of one load transistor P1 recovers up to the constant current while including a displacement current for charge-up of the collector capacitance of driver transistor N1. At the other load transistor P2, a collector current flows therein as a displacement current used to charge up the large collector capacitance of driver transistors N21, N22, causing a base current of the transistor P3 to be pulled out of it. In responding thereto, an H pulse generates at the terminal of resistor R1 and is then supplied to the latch circuit 23. This would result in the voltage Vout=L being latched in latch circuit 23, although not specifically required.

As previously stated, the signal voltage detector circuit of FIG. 13 or 15 is encountered with the risk of unwanted occurrence of operation errors or malfunction due to power noises because of the presence of the collector capacitance of more than one driver transistor used. The driver-transistor collector capacitance stays harmless with respect to ordinary or standard signal detection operations. However, in the event that the power supply voltage recovers to its normally expected potential level once after rapid or "spike"-like drop-down due to externally attendant noises or else, the displacement current for chargeup of the collector capacitance flows in accordance with a potential change of the supply voltage without regard to the absence of any input to the differential amplifier. This displacement current flow can cause malfunction.

More practically, the circuit of FIG. 13 is faced with a problem as to the inequality or "imbalance" of parasitic capacitances associated with the drain side of P-channel MOS transistors MP1, MP2 making up the current mirror circuit 12. Whereas the large collector capacitance of driver transistor N2 enters at the drain of MOS transistor MP1, the drain of MOS transistor MP2 is less in parasitic capacitance. Due to this, the displacement current of driver transistor N2 which happens to flow in power supply voltage recovery events causes operation errors or malfunction.

On the other hand, the circuit of FIG. 15 suffers from a problem as to the imbalance of the parasitic capacitances associated with the drain side of PNP transistors P1, P2 making up the current mirror load of the differential amplifier 21. More specifically, while the differential amplifier 21 employs a single driver transistor N1 to which the reference voltage Vref is input, its signal voltage input side is such that the parallel-coupled two separate driver transistors N21, N22 are provided. The result of this is that the load transistor P2 is greater than load transistor P1 in drain-side parasitic capacitance value. Due to this parasitic capacitance inequality or "nonequilibrium," the displacement current flowing in one driver transistor N1 and a total displacement current flowing in the other driver transistors N21, N22 are such that the latter is greater than the former in power supply voltage recovery events. In other words, the differential amplifier 21 behaves to operate improperly as if it detects an input signal in the supply voltage recovery events. This can cause malfunction.

SUMMARY OF THE INVENTION

A signal voltage detection circuit is provided to have a differential amplifier having first and second driver transistors to which a reference voltage and a signal voltage to be detected are input respectively, a current-mirror circuit configured to generate an output current corresponding to a detection output of the differential amplifier, a current-to-voltage conversion circuit configured to convert a change in output current of the current mirror circuit into a voltage and output the voltage converted, a latch circuit to which an output of the current-to-voltage conversion circuit is transferred and in which the output is held, and a capacitive load element connected to an input node of the current-to-voltage conversion circuit.

DETAILED DESCRIPTION OF THE INVENTION

An explanation will now be given of several embodiments of this invention with reference to the accompanying drawings below.

Embodiment 1

Figure 1:
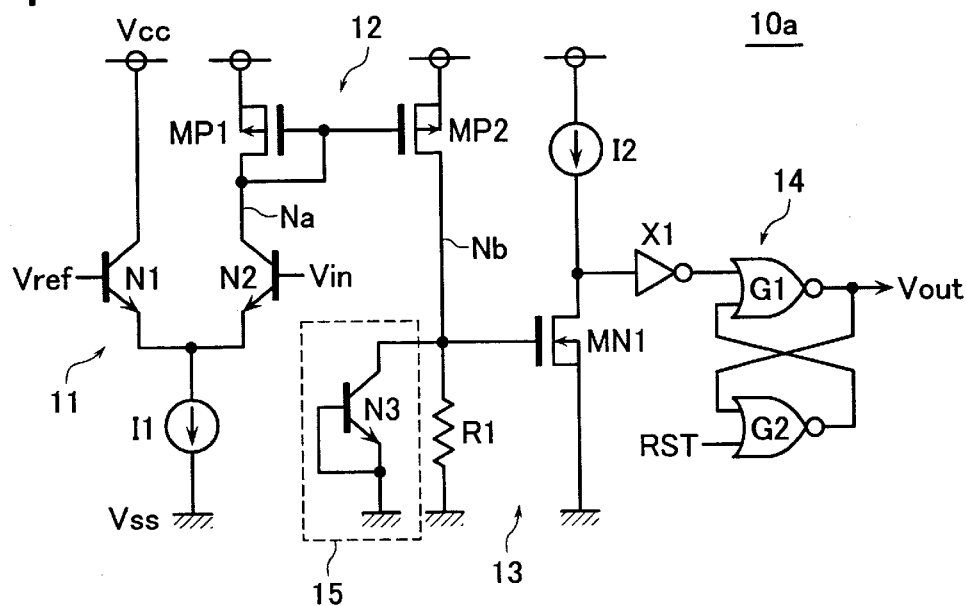
FIG. 1 is a diagram showing a signal voltage detection circuit in accordance with an embodiment of this invention.
Figure 13:
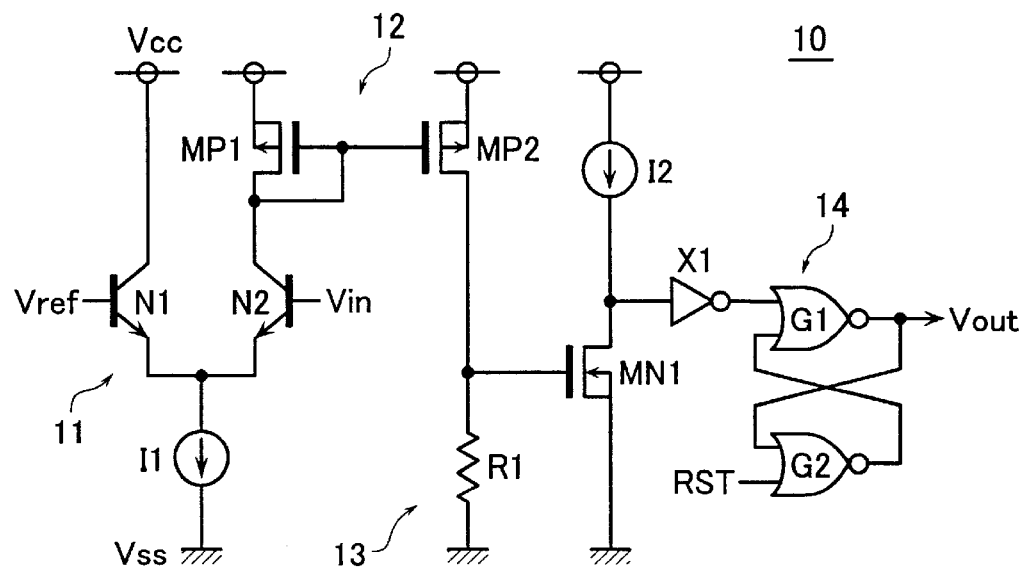
FIG. 13 is a diagram showing a prior known signal voltage detector circuit.

FIG. 1 illustrates a signal voltage detection circuit 10a in accordance with an embodiment of this invention, which is an improved version of the signal voltage detector circuit 10 of FIG. 13. As shown herein, the signal voltage detection circuit 10a includes a differential amplifier 11, which has a pair of NPN driver transistors N1, N2 with their emitters commonly connected together to a current source I1. One transistor N1 has a base to which a reference voltage Vref is input and a collector coupled to a power supply voltage Vcc. The remaining transistor N2 has its base to which a to-be-detected signal voltage Vin is input and a collector connected to the supply voltage Vcc through a P-channel MOS transistor MP1.

The P-channel MOS transistor MP1 is such that its gate and drain are connected together. This MOS transistor MP1 and its associated P-channel MOS transistor MP2 constitute a current mirror circuit 12, which is operable to take out a detection output of the differential amplifier 11 as a current.

For use as a current-to-voltage conversion circuit 13 for converting the output current of the current mirror circuit 12 into a voltage, the circuit of FIG. 1 has a resistor R1 which is connected between the drain of MOS transistor MP2 and the ground potential Vss and a sense-use N-channel MOS transistor MN1 having its gate connected to a node Nb of this resistor R1. MOS transistor MN1 has a drain, to which a current source I2 is connected. A drain voltage change of this MOS transistor MN1, which is a detection output of the current-voltage conversion circuit 13, is transferred through an inverter X1 toward a latch circuit 14. The latch circuit 14 is configured from NOR gates G1, G2.

Unlike the prior art circuit of FIG. 13, the signal voltage detector circuit 10a of the illustrative embodiment is such that a capacitive load element 15 is connected to the output node Nb of the current mirror circuit 12 (thus, an input node of the current-voltage converter circuit 13). The capacitive load element 15 is for balancing parasitic capacitances of the drain nodes Na, Nb of MOS transistors MP1, MP2 of current mirror circuit 12 so that these capacitances become substantially equal in value to each other. In case the MOS transistors MP1, MP2 are the same in size as each other, an NPN transistor N3 is employable as the capacitive load element 15, which transistor is the same in structure and size as the driver transistor N1, N2 of the differential amplifier 11. Transistor N3 has its base and emitter which are coupled to ground voltage Vss and also has a collector connected to the node Nb. With such an arrangement, transistor N3 is rendered nonconductive, that is, retains its turn-off state, which would result in its collector capacitance being added to node Nb.

Figure 14:
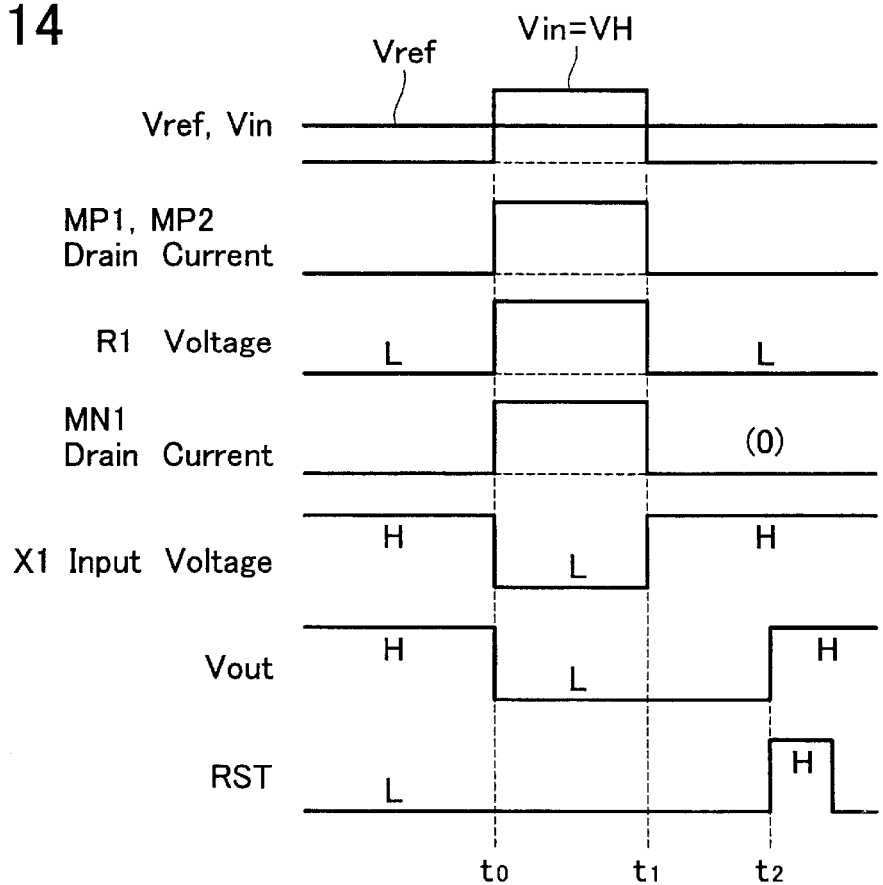
FIG. 14 is an operation timing diagram of the prior art signal voltage detector circuit.

Principally an operation of this signal voltage detector circuit 10a is similar to that of the prior art discussed previously in the introductory part of the description in conjunction with FIG. 14. When a signal voltage Vin potentially exceeds the reference voltage Vref, this is detected by the differential amplifier 11, which then generates a detection output. An output current corresponding to such detection output is taken out by the current mirror circuit 12. This output current flows in the resistor R1. When the voltage of node Nb increases in potential to go beyond the threshold voltage of the MOS transistor MN1, this MOS transistor MN1 turns on. In responding thereto, an H pulse is input to the latch circuit 14, which holds and latches therein a detection result of Vout=L.

Figure 2:
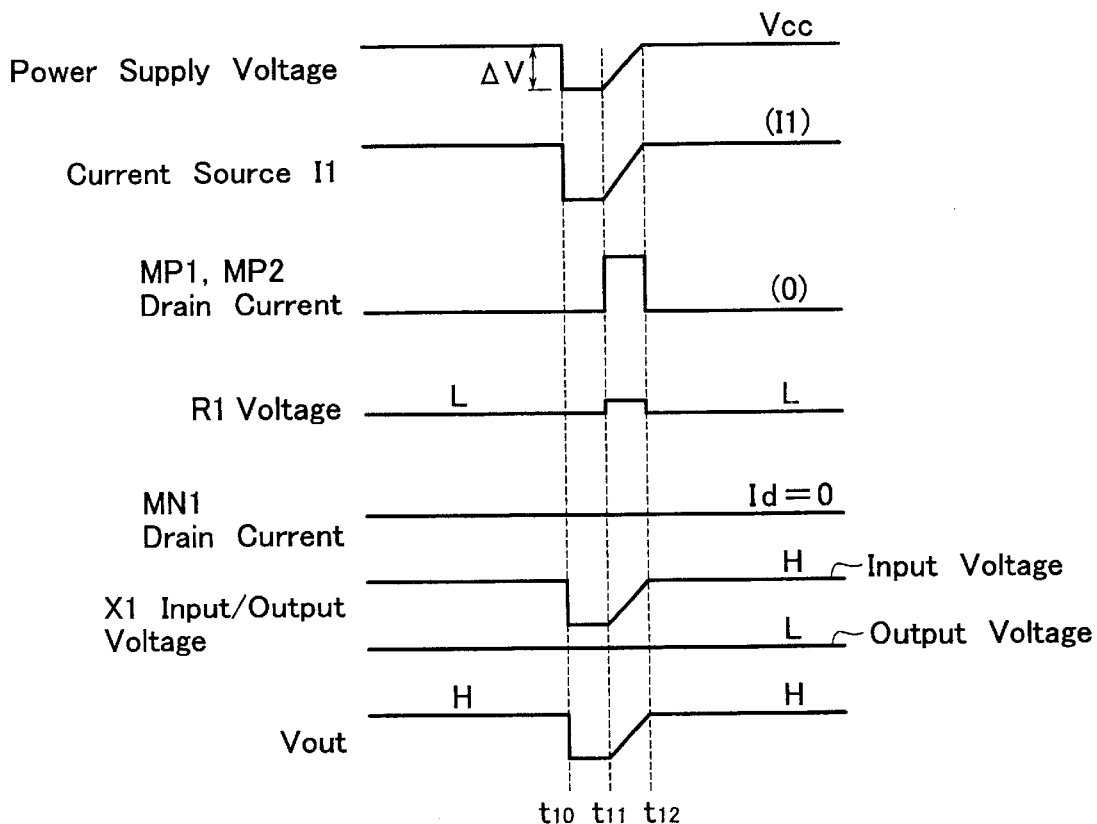
FIG. 2 is an operation timing diagram of the signal voltage detector circuit in a power supply noise generation event.
Figure 17:
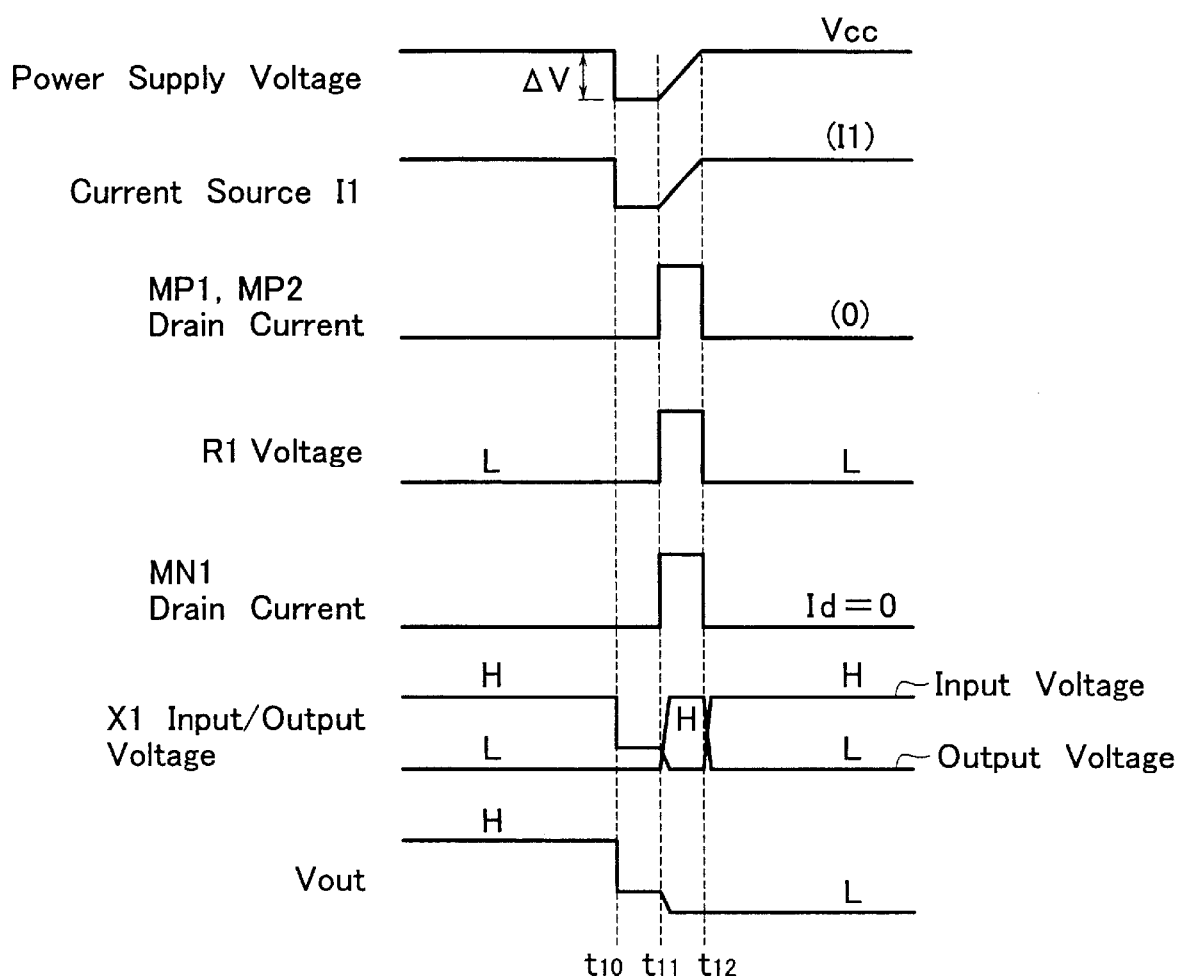
FIG. 17 is an operation timing diagram of the circuit of FIG. 13 in a power noise generation event.

An explanation will be given of the way of precluding operation failures or malfunction otherwise occurring due to power supply noises in this embodiment with reference to a timing diagram of FIG. 2. This timing diagram corresponds to that of FIG. 17 of the prior art stated previously. Suppose that the power supply voltage Vcc potentially decreases by a certain degree ΔV at a time point t10. In response to receipt of this potential dropdown, the current of the current source I1 of differential amplifier 11 likewise decreases. And, upon start-up of recovery of the supply voltage at a time point t11, drain currents which are due to displacement currents for charge-up of the parasitic capacitances at nodes Na, Nb rush to flow in the P-channel MOS transistors MP1, MP2 of the current mirror circuit 12.

The parasitic capacitances of the node Na, Nb are the between-the-collector-and-ground capacitances of the transistors N2, N3, respectively: these capacitances are substantially equal in value to each other. Accordingly, the drain current of MOS transistor MP2 is mainly used to charge up the collector capacitance of transistor N3, with any current hardly flowing in the resistor R1. The result of this is that the terminal voltage of resistor R1 (i.e. potential at node Nb) will no longer increase even in the supply voltage recovery event. The terminal voltage can slightly rise up in potential; even in this case, as far as such tiny potential riseup stays less than or equal to the threshold voltage of MOS transistor MN1, the MOS transistor MN1 does not turn on. Thus the drain current stays at Id=0. Accordingly, the input node of the inverter X1—this has been decreased due to a potential decrease of the supply voltage—returns at H level upon recovery of the supply voltage at a time point t12 so that any H pulse is not obtainable at inverter X1. To be brief, the latch circuit 14 is kept in the original state of Vout=H even during the supply voltage recovery. Thus, Vout=L will hardly be erroneously held therein.

Embodiment 2

Figure 3:
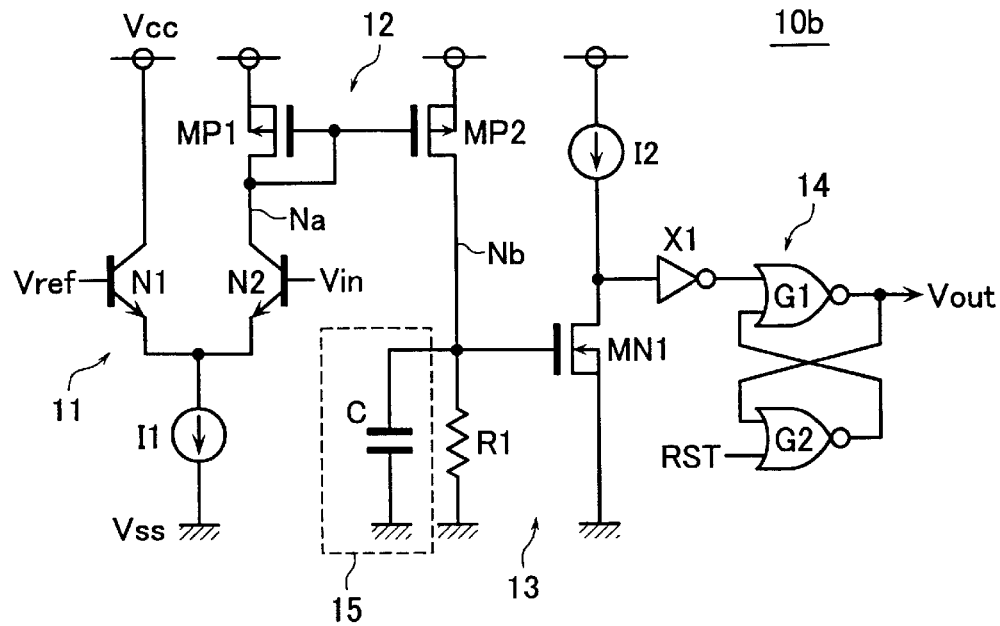
FIG. 3 is a diagram showing a signal voltage detector circuit in accordance with another embodiment.

Turning to FIG. 3, there is depicted a signal voltage detector circuit 10b which is a modified one of the circuit of FIG. 1. A difference of this circuit from that shown in FIG. 1 is that the former employs as the capacitive load element 15 a capacitor C which has its capacitance that is substantially the same as the collector capacitance of the driver transistor N2. With such an arrangement also, it is possible to prevent or at least greatly suppress any possible malfunction otherwise occurring due to power supply noises.

Embodiment 3

Figure 4:
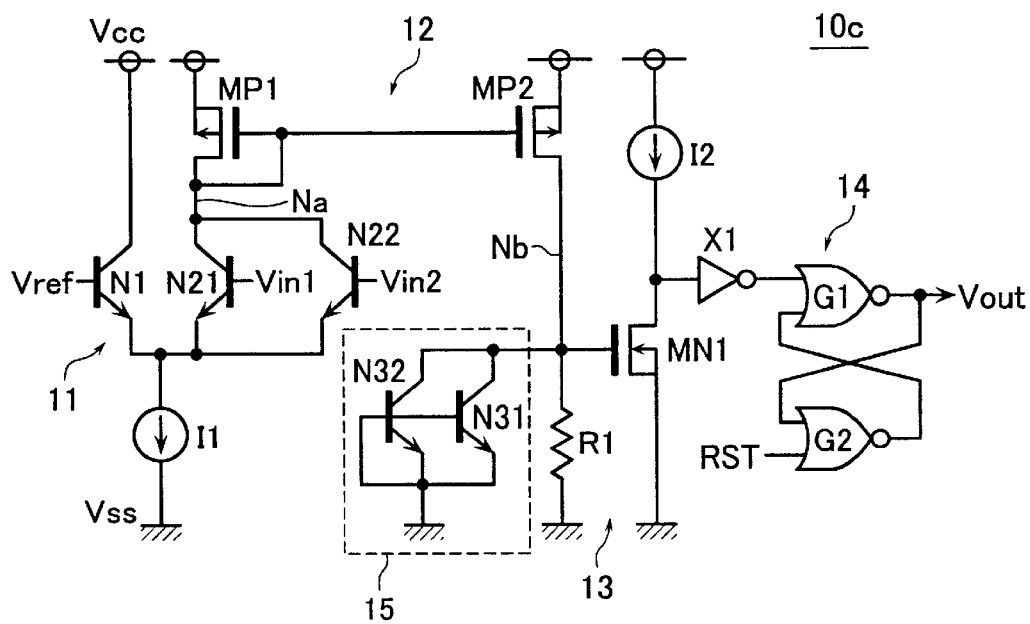
FIG. 4 is a diagram showing a signal voltage detector circuit in accordance with a further embodiment.

Referring next to FIG. 4, a signal voltage detector circuit 10c also embodying the invention is shown, which is another modification of the FIG. 1 circuit. As shown herein, the differential amplifier 11 is arranged to have a parallel combination of driver transistors N21, N22, which are provided to receive two separate input signal voltages Vin1, Vin2 respectively. In this case, for use as the capacitive load element 15 also, two NPN transistors N31, N32 are parallel provided at the node Nb. These transistors are equal in collector capacitance to the driver transistors N21, N22 stated supra. With such an arrangement, it is possible to prevent or minimize malfunction otherwise occurring due to power noises.

More generally, in cases where an increased number—n, where n>1—of driver transistors are provided in parallel with input signal voltages being sent thereto respectively, similar effects are obtainable by providing a parallel combination of n transistors which are the same in shape and size as the driver transistors at node Nb as the capacitive load element 15.

Embodiment 4

Figure 5:
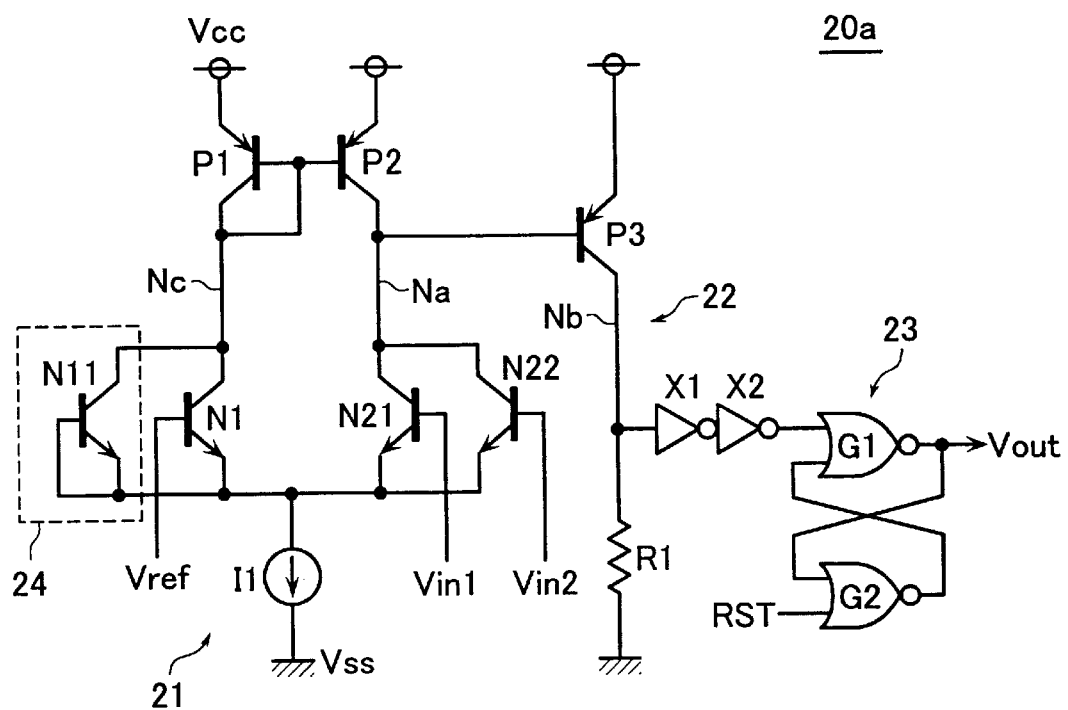
FIG. 5 is a diagram showing a signal voltage detector circuit in accordance with another further embodiment.
Figure 15:
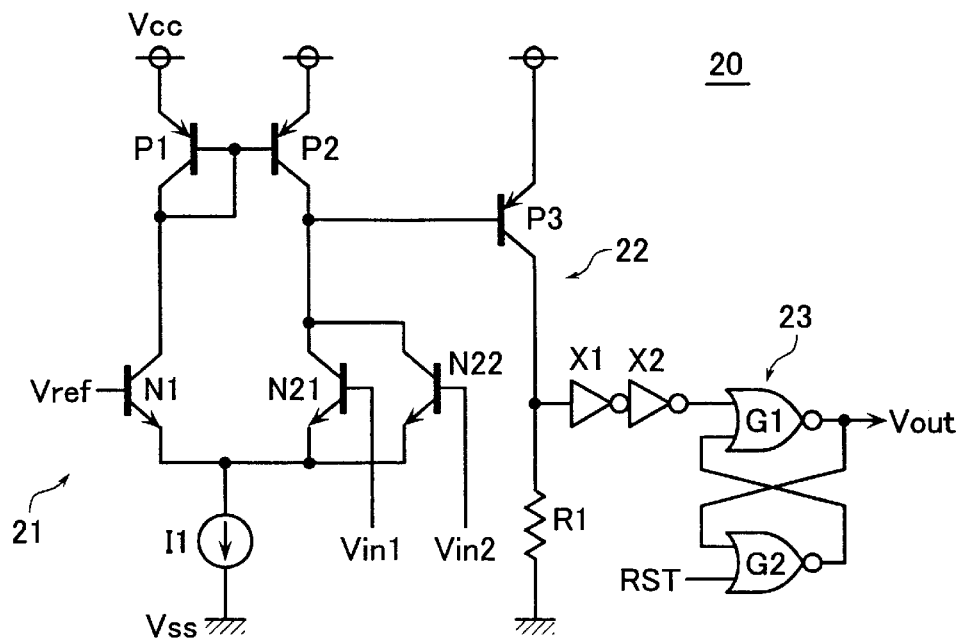
FIG. 15 is a diagram showing another prior art signal voltage detector circuit.

A signal voltage detector circuit 20a also embodying the invention is shown in FIG. 5, which is an improved one of the signal voltage generator circuit 20 of FIG. 15. A differential amplifier 21 has an NPN transistor N1 for use as a driver to which the reference voltage Vref is input and also a couple of NPN transistors N21, N22 which function as drivers and to which signal voltages Vin1, Vin2 are input respectively. These transistors have their emitters which are commonly connected together to the current source I1.

The driver transistor N1 has a collector node Nc, which is coupled to the power supply voltage Vcc through a PNP transistor P1 for use as a load. The driver transistors N21, N22 have a collector node Na coupled to supply voltage Vcc via a PNP transistor P2 that serves as a load. The transistors P1, P2 have gates common-coupled together to the node Nc, thus making up a current mirror load.

In order to take out a detection output at the node Na of the differential amplifier 21, a voltage amplifying unit 22 is provided. The voltage amplifier unit 22 is configured from a serial combination of a PNP transistor P3 and a resistor R1. The PNP transistor P3 has its base connected to the node Na and its emitter coupled to the supply voltage Vcc and also a collector. The resistor R1 is connected between the collector and ground voltage Vss. And, the illustrative circuitry has a latch circuit 23, to which an H pulse obtainable at the node Nb of resistor R1 when a signal is detected is input via a series circuit of inverters X1, X2.

In this embodiment, in order to maintain the capacitive balance of the nodes Nc, Na of differential amplifier 21, an NPN transistor Nil is additionally provided as a capacitive load element 24. This transistor N11 is connected in parallel to the reference-side driver transistor N1 and is the same in structure and size as transistor N1. Transistor Nil has its base and emitter commonly connected together to the current source I1 and also has a collector connected to node Nc. Accordingly, transistor N11 is normally kept nonconductive, i.e. turned off. This results in addition of a capacitive load to node Nc.

Figure 16:
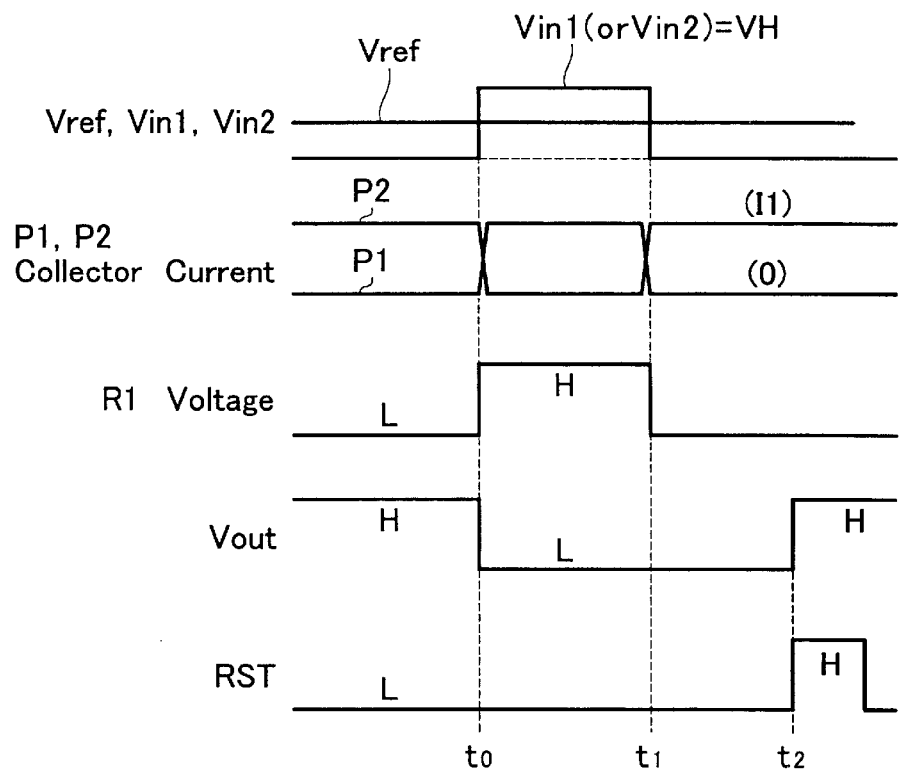
FIG. 16 is an operation timing diagram of the another prior art signal voltage detector circuit.

An operation of this signal voltage detector circuit 20a is the same in principle as that of the FIG. 16 circuit discussed previously. When a signal voltage Vin potentially exceeds the reference voltage Vref, this is detected by the differential amplifier 21. More specifically, the node Na potentially decreases causing the PNP transistor P3 to turn on as a result of the flow of a base current therein. This in turn permits a collector current to flow. Whereby, an H pulse is obtained at node Nb, causing the latch circuit 23 to hold therein a detection result of Vout=L.

Figure 6:
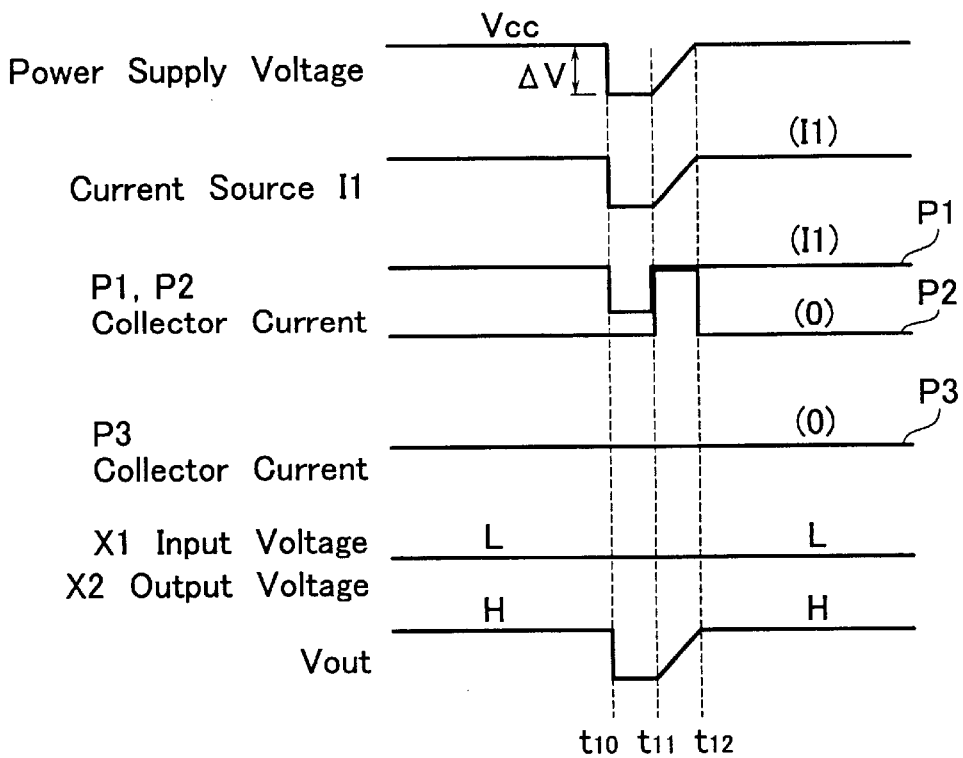
FIG. 6 is an operation timing diagram of the signal voltage detector circuit in the power supply noise generation event.
Figure 18:
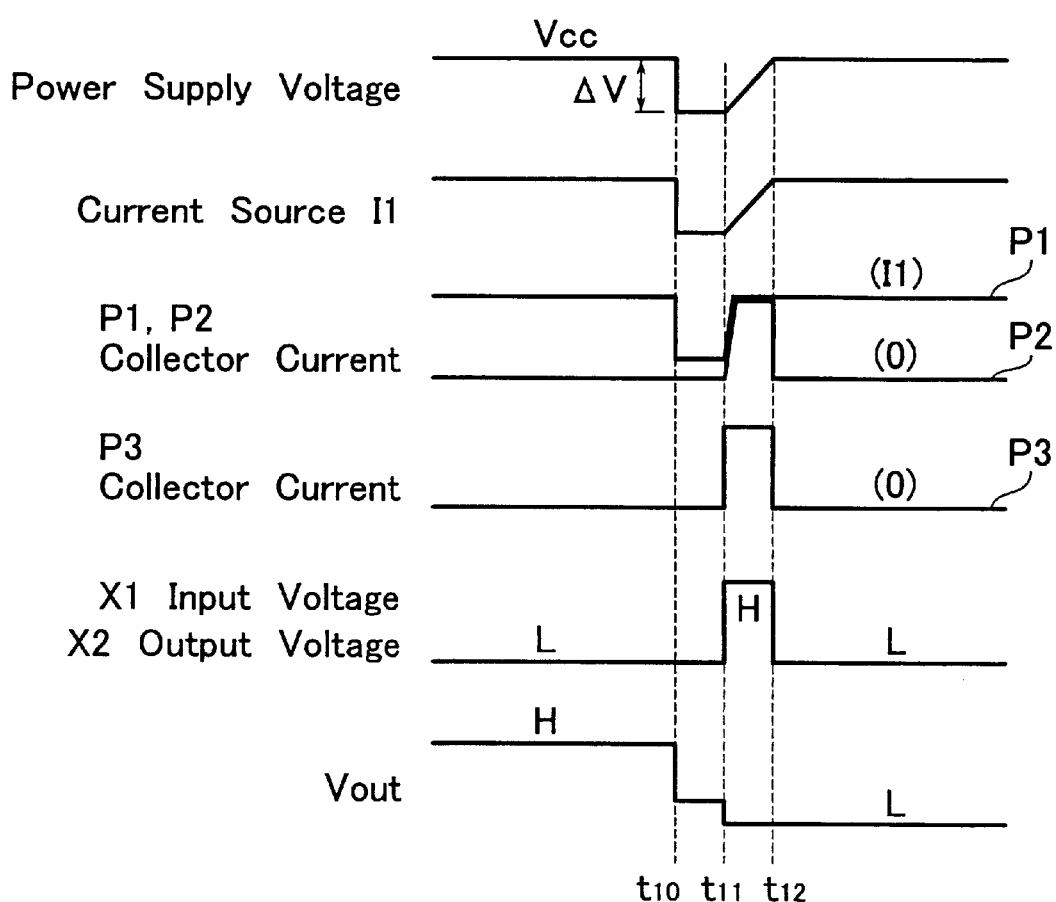
FIG. 18 is an operation timing diagram of the FIG. 15 circuit in the power noise generation event.

An explanation will be given of the way of avoiding malfunction due to power noises in this embodiment with reference to a timing diagram of FIG. 6. This timing diagram corresponds to FIG. 18 of the prior art circuit. Imagine that the power supply voltage Vcc potentially decreases by ΔV at an instant t10. In response to receipt of this potential drop, the current source I1 of differential amplifier 21 also decreases in current flowing therein. In turn, transistors P1, which makes up an active load together with transistor P2 and is flowing a constant current, also decreases in current. And, when the potential recovery of the supply voltage is get started at an instant t11, drain currents due to the displacement currents for chargeup of the parasitic capacitances of node Nc, Na flow in transistors P1, P2, respectively.

The parasitic capacitance of the node Nc is the collector-to-ground capacitance of transistors (N1, N11). Similarly the parasitic capacitance of node Na is that of transistors (N21, N22). These parasitic capacitances are substantially equal in value to each other. Consequently, the transistors P1, P2 are almost equal to each other in displacement current-based drain current flowing therein in the supply voltage recovery event. The node Na is kept unchanged in potential. Accordingly the transistor P3 is such that its base current is not pulled out of it and thus hardly turns on, causing no current to flow in resistor R1. As a result of this, the inverters X1, X2 no longer output the H pulse in the supply voltage recovery event. This allows the latch circuit 23 to recover to its original state of Vout=H.

Embodiment 5

Figure 7:
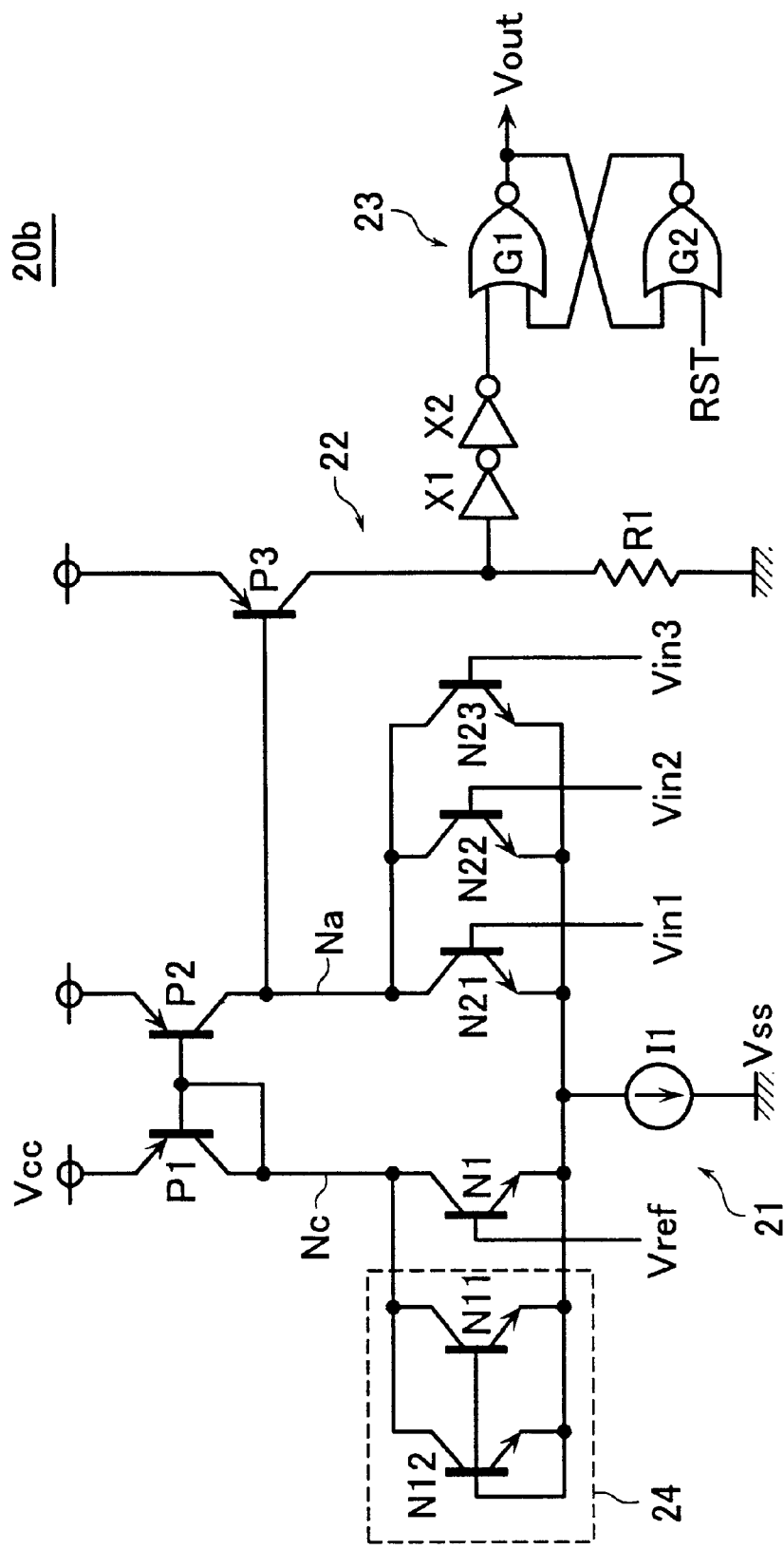
FIG. 7 is a diagram showing a signal voltage detector circuit in accordance with still another embodiment.

A signal voltage detector circuit 20b in accordance with a further embodiment of the invention is shown in FIG. 7, which is a modified version of the embodiment circuit of FIG. 5. A difference of the FIG. 7 circuit over the FIG. 5 circuit is that the differential amplifier 21 includes a parallel combination of three NPN driver transistors N21, N22, N23, to which three separate signal voltages Vin1, Vin2, Vin3 are input respectively. In this case, two NPN transistors N11, N12 are parallel-provided at the node Nc as the capacitive load element 24. With such an arrangement, the nodes Nc, Na become substantially equal to each other in parasitic capacitance value, thus enabling preclusion of any possible malfunction due to power noises.

More generally, in cases where an increased number, n (n≧2), of driver transistors are provided in parallel with input signal voltages being passed thereto respectively, similar effects are obtainable by provision of a parallel combination of (n−1i) transistors of the same size as the driver transistors at node Nc as the capacitive load element 15.

Other Embodiments

Although in the embodiments stated supra bipolar transistors are used as the driver transistors of differential amplifiers thereof, the principles of this invention may also be applicable to those using MOS transistors in place of such bipolar transistors.

Figure 8:
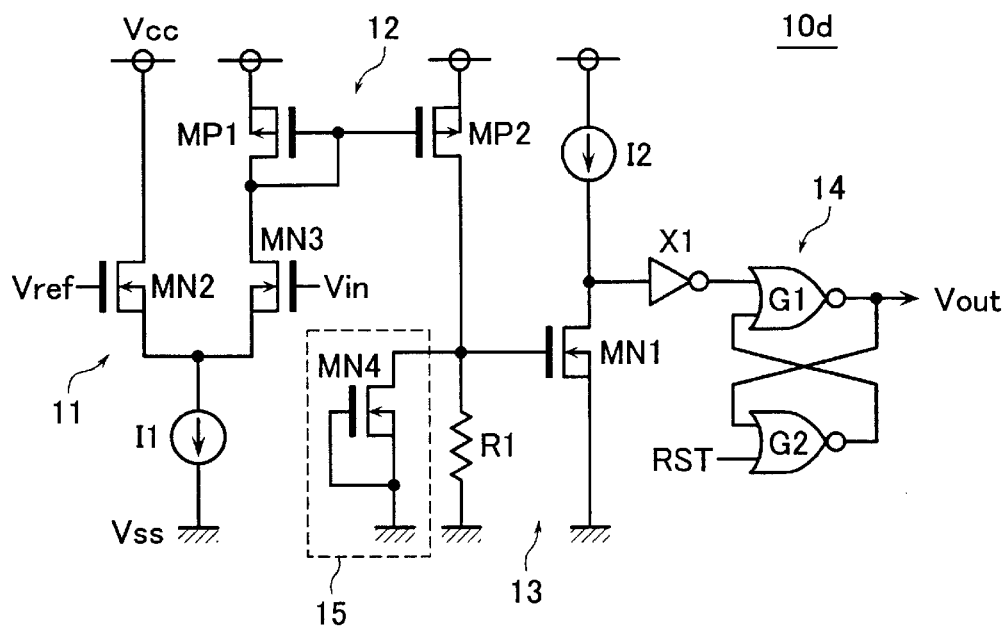
FIG. 8 is a diagram showing a signal voltage detector circuit in accordance with another further embodiment.

A signal voltage detector circuit 10d shown in FIG. 8 is an example which employs N-channel MOS transistors MN2, MN3 in lieu of the NPN driver transistors N1, N2 of the differential amplifier 11 in the signal voltage detector circuit 10a of FIG. 1. In pursuance of this alteration in circuit configuration, the capacitive load element 15 also is modified to use an N-channel MOS transistor MN4 which is the same in shape and size as the MOS transistor MN2, MN3 and which has its gate and source coupled together.

Figure 9:
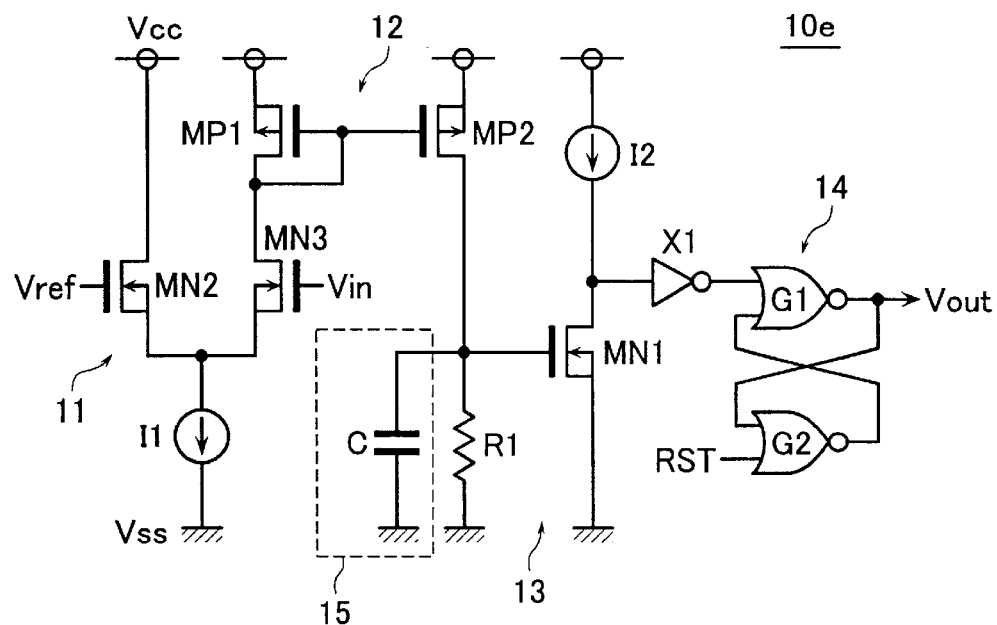
FIG. 9 is a diagram showing a signal voltage detector circuit in accordance with still another further embodiment.

Similarly, a signal voltage detector circuit 10e shown in FIG. 9 is arranged to use N-channel MOS transistors MN2, MN3 in place of the NPN driver transistors N1, N2 of the differential amplifier 11 in the signal voltage detector circuit 10a of FIG. 1. And, a capacitor C is used as the capacitive load element 15 required.

Figure 10:
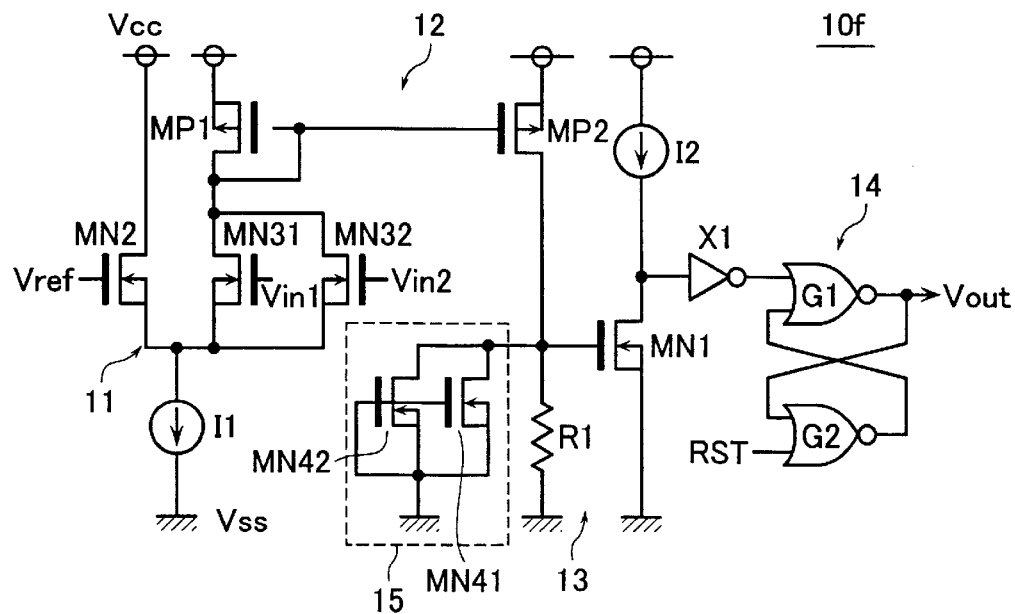
FIG. 10 is a diagram showing a signal voltage detector circuit in accordance with yet another further embodiment.

A signal voltage detector circuit 10f of FIG. 10 is an example which uses N-channel MOS transistors MN2, MN31, MN32 rather than the NPN driver transistors N1, N21, N22 of the differential amplifier 11 in the signal voltage detector circuit 10c of FIG. 4. With such modification, the capacitive load element 15 is designed to use gate/source-coupled N-channel MOS transistors MN41, MN42 which are the same in structure and size as the MOS transistors MN2, MN31, MN32.

Figure 11:
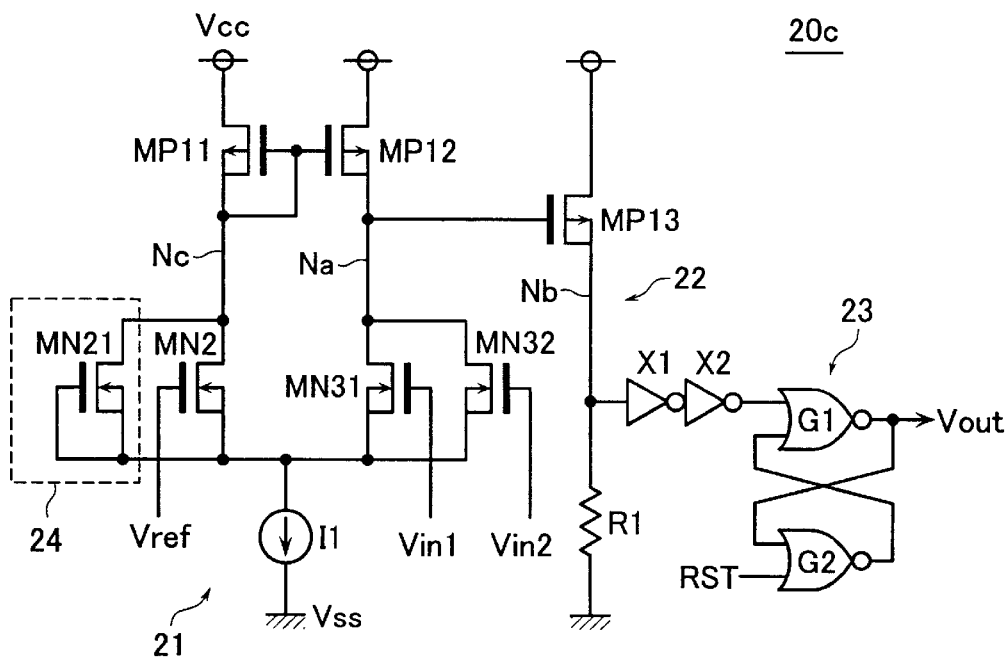
FIG. 11 is a diagram showing a signal voltage detector circuit in accordance with yet another further embodiment.

A signal voltage detector circuit 20c of FIG. 11 is an example which uses N-channel MOS transistors MN2, MN31, MN32 in lieu of the NPN driver transistors N1, N21, N22 of the differential amplifier 21 in the signal voltage detector circuit 20a of FIG. 5. With this change, the capacitive load element 24 is modified to use an N-channel MOS transistor MN21 with its gate and source coupled together. At the portions of the PNP transistors P1, P2, P3 in FIG. 5 also, P-channel NOS transistors MP11, MP12, MP13 are used.

Figure 12:
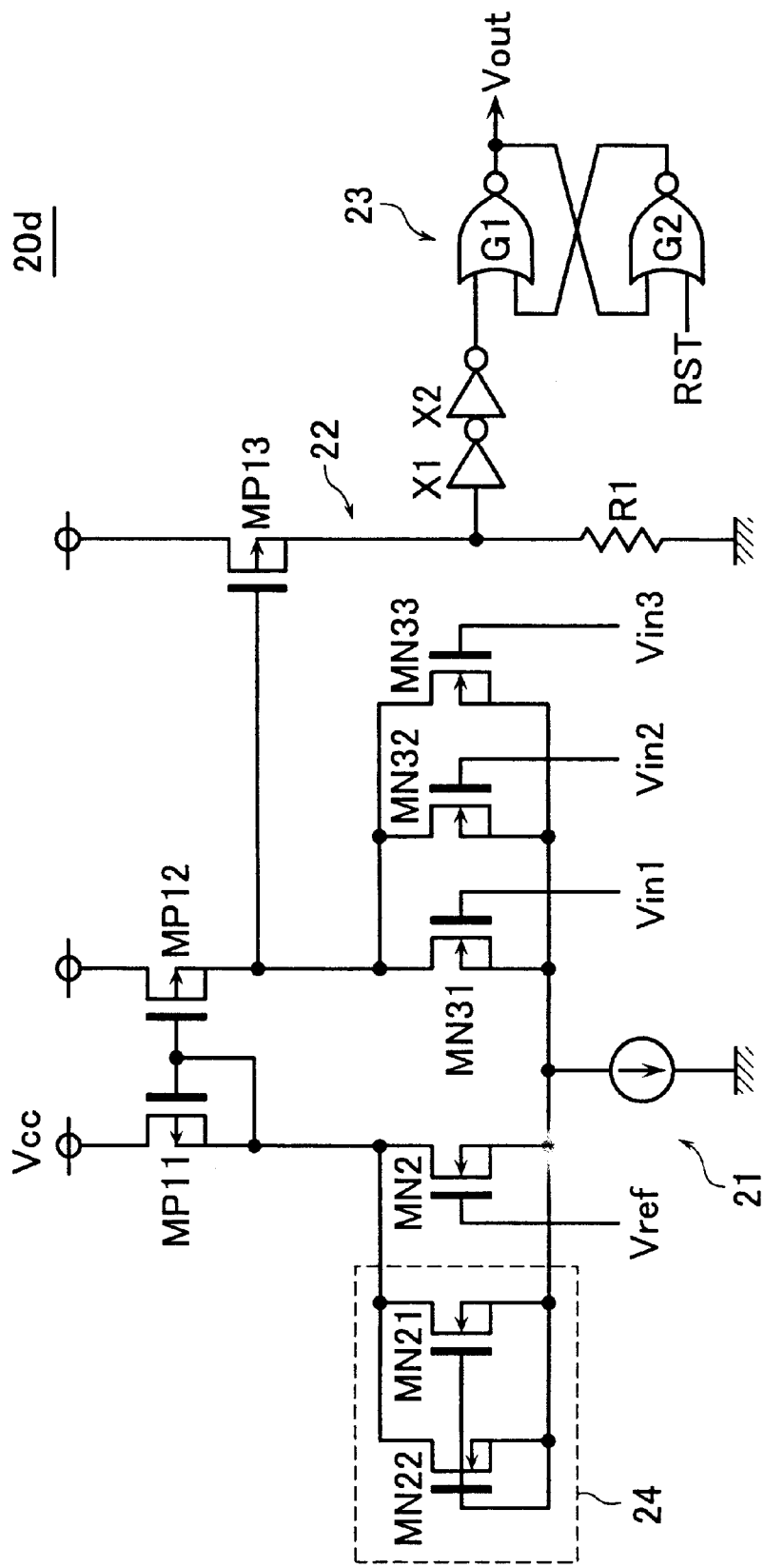
FIG. 12 is a diagram showing a signal voltage detector circuit in accordance with a still another embodiment.

A signal voltage detector circuit 20d of FIG. 12 is an example which uses N-channel MOS transistors MN2, MN31 to MN33 in place of the NPN driver transistors N1, N21–N23 of the differential amplifier 21 in the signal voltage detector circuit 20b of FIG. 7. With this alteration, the illustrative circuit uses as the capacitive load element 24 gate/source-coupled N-channel MOS transistors MN21, MN22 which are the same in structure and size as the MOS transistors MN2, MN31–MN33. At the portions of the PNP transistors P1, P2, P3 in FIG. 7 also, P-channel MOS transistors MP11, MP12, MP13 are employed.

As has been apparent from the foregoing, according to this invention, it is possible to provide improved signal voltage detection circuitry capable of preventing operation errors or failures otherwise occurring due to power supply noises.

While the invention has been described with reference to specific embodiments, the description is illustrative of the invention and is not be construed as limiting the invention. Various modifications and applications may occur to those skilled in the art without departing from the spirit and scope of the invention as defined by the appended acclaims.

What is claimed is:

1. A signal voltage detection circuit comprising:
   a differential amplifier having first and second driver transistors to which a reference voltage and a signal voltage to be detected are input respectively;
   a current mirror circuit configured to generate an output current corresponding to a detection output of said differential amplifier;
   a current-to-voltage conversion circuit configured to convert a change in the output current of said current mirror circuit into a voltage and output the voltage converted;
   a latch circuit to which an output of said current-to-voltage conversion circuit is transferred and in which the output is held; and
   a capacitive load element connected to an input node of said current-to-voltage conversion circuit.

2. The signal voltage detection circuit according to claim 1, wherein the first and second driver transistors of said differential amplifier are bipolar transistors with emitters commonly connected to a current source, and wherein said capacitive load element is a bipolar transistor having base and emitter coupled together and having the same structure and size as the driver transistors as used in said differential amplifier.

3. The signal voltage detection circuit according to claim 1, wherein said first and second driver transistors of said differential amplifier are bipolar transistors with emitters commonly coupled to a current source, and wherein said capacitive load element is a capacitor having a capacitance substantially the same as a collector capacitance of said driver transistors of said differential amplifier.

4. The signal voltage detection circuit according to claim 1, wherein said first and second driver transistors of said differential amplifier are metal oxide semiconductor (MOS) transistors with sources commonly connected to a current source and wherein said capacitive load element is a MOS transistor having gate and source commonly coupled together and the same structure and size as said driver transistors used in said differential amplifier.

5. The signal voltage detection circuit according to claim 1, wherein said differential amplifier has n (n$\geq$2) second driver transistors which are parallel provided and to which different signal voltages are input, and wherein said capacitive load element is comprised of n parallel provided transistors having the same structure and size as said driver transistors used in said differential amplifier.

6. A signal voltage detection circuit comprising:
   a differential amplifier having a first driver transistor which is connected to a first output node and to which a reference voltage is input, n (n$\geq$2) second driver transistors which are connected in parallel to a second output node and to which different signal voltages to be detected are input respectively, a first load transistor connected between said first output node and a power supply terminal, and a second load transistor connected between said second output node and said power supply terminal for constituting a current mirror together with said first load transistor;
   a latch circuit to which a detection output of said second output node of said differential amplifier is transferred and in which said detection output is held; and
   a capacitive load element connected to said first output node of said differential amplifier.

7. The signal voltage detection circuit according to claim 6, wherein said first and second driver transistors of said differential amplifier are bipolar transistors with emitters commonly connected to a current source, and wherein said capacitive load element is (n−1) parallel-connected bipolar transistors each of which has a base and an emitter commonly connected together and which are the same in structure and size as said driver transistors used in said differential amplifier.

8. The signal voltage detection circuit according to claim 6, wherein said first and second driver transistors of said differential amplifier are bipolar transistors with emitters commonly connected to a current source, and wherein said capacitive load element is a capacitor having a capacitance substantially equal to a collector capacitance of (n−1) ones of said driver transistors of said differential amplifier.

9. The signal voltage detection circuit according to claim 6, wherein said first and second driver transistors of said differential amplifier are MOS transistors with sources commonly connected to a current source, and wherein said capacitive load element is (n−1) parallel-connected MOS transistors having the same structure and size as said driver transistors used in said differential amplifier and each having its gate and source commonly connected together.

* * * * *